(12) United States Patent
Tang et al.

(10) Patent No.: US 11,573,471 B2
(45) Date of Patent: Feb. 7, 2023

(54) ARRAY SUBSTRATE AND LIQUID CRYSTAL DISPLAY PANEL

(71) Applicant: Wuhan China Star Optoelectronics Technology Co., Ltd., Wuhan (CN)

(72) Inventors: Wei Tang, Wuhan (CN); Gaiping Lu, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/615,871

(22) PCT Filed: Aug. 21, 2019

(86) PCT No.: PCT/CN2019/101664
§ 371 (c)(1),
(2) Date: Nov. 22, 2019

(87) PCT Pub. No.: WO2020/252885
PCT Pub. Date: Dec. 24, 2020

(65) Prior Publication Data
US 2022/0214572 A1 Jul. 7, 2022

(30) Foreign Application Priority Data
Jun. 17, 2019 (CN) .......................... 201910520389.5

(51) Int. Cl.
*G02F 1/1368* (2006.01)
*G02F 1/1362* (2006.01)
*H01L 27/12* (2006.01)

(52) U.S. Cl.
CPC ...... *G02F 1/1368* (2013.01); *G02F 1/136277* (2013.01); *H01L 27/1218* (2013.01)

(58) Field of Classification Search
CPC ............. G02F 1/1368; G02F 1/136277; H01L 27/1218
USPC ......................................... 349/138, 155–157
See application file for complete search history.

(56) References Cited

U.S. PATENT DOCUMENTS

| 10,520,662 | B1* | 12/2019 | Chen ..................... G02F 1/1333 |
| 2010/0315570 | A1 | 12/2010 | Mathew |
| 2013/0258234 | A1 | 10/2013 | Park |
| 2015/0241732 | A1 | 8/2015 | Kim et al. |
| 2019/0331960 | A1 | 10/2019 | Li et al. |
| 2019/0334120 | A1* | 10/2019 | Seo ....................... G06F 3/0445 |

(Continued)

FOREIGN PATENT DOCUMENTS

| CN | 102636896 A | 8/2012 |
| CN | 103365354 A | 10/2013 |

(Continued)

*Primary Examiner* — Charles S Chang
(74) *Attorney, Agent, or Firm* — PV IP PC; Wei Te Chung; Ude Lu

(57) ABSTRACT

The present application provides an array substrate and a liquid crystal display panel. The array substrate includes: a substrate including a display area and a light-transmitting functional area; a buffer layer disposed on the substrate and covering the display area and the light-transmitting functional area; a thin film transistor array layer disposed on the buffer layer, the thin film transistor array layer is provided with an aperture, and the aperture and the light-transmitting functional area are aligned with each other; and a support filling structure disposed in the aperture.

12 Claims, 2 Drawing Sheets

(56) References Cited

U.S. PATENT DOCUMENTS

| | | | | |
|---|---|---|---|---|
| 2020/0174301 A1* | 6/2020 | Tien | ................... | H04M 1/0264 |
| 2020/0310186 A1* | 10/2020 | Ina | ................... | G02F 1/133514 |
| 2021/0359282 A1* | 11/2021 | Sun | ................... | H01L 51/5253 |
| 2021/0359284 A1* | 11/2021 | Li | ..................... | H01L 27/3244 |

FOREIGN PATENT DOCUMENTS

| | | |
|---|---|---|
| CN | 108594524 A | 9/2018 |
| CN | 109100891 A | 12/2018 |
| CN | 109307962 A | 2/2019 |
| CN | 109459879 A | 3/2019 |

* cited by examiner

ARRAY SUBSTRATE AND LIQUID CRYSTAL DISPLAY PANEL

FIELD OF INVENTION

The present application relates to the field of display technology, and in particular, to an array substrate and a liquid crystal display panel.

BACKGROUND OF INVENTION

As requirements for aesthetics of electronic devices are getting higher and higher, in-plane boring technology has appeared. However, there are many problems in in-plane boring technology. For example, strip-shaped interference fringes often appear at sites of blind holes during optical testing.

TECHNICAL PROBLEM

The present application provides a liquid crystal display panel, which can solve the technical problem that current liquid crystal display panel easily generates interference fringes at sites of blind holes.

SUMMARY OF INVENTION

An embodiment of the present application provides an array substrate, including a substrate having a display area and a light-transmitting functional area; a buffer layer disposed on the substrate and covering the display area and the light-transmitting functional area; a thin film transistor array layer disposed on the buffer layer, wherein the thin film transistor array layer is provided with an aperture, the aperture and the light-transmitting functional area are aligned with each other; and a support filling structure disposed in the aperture.

In the array substrate described in the present application, the thin film transistor array layer includes a first metal layer, a semiconductor layer, a second metal layer, a first insulating layer, a second insulating layer, and a first planarization layer; and the first insulating layer is disposed on the buffer layer, the first planarization layer is disposed on the first insulating layer, and the second insulating layer is disposed on the first planarization layer.

In the array substrate described in the present application, the support filling structure includes a plurality of support pillars distributed in uniform intervals in the apertures, the aperture is a via-hole penetrating to an upper surface of the buffer layer.

In the array substrate described in the present application, the support pillar is a remaining portion of a first insulating layer, a first planarization layer, and a second insulating layer which are sequentially stacked in a groove formed on the thin film transistor array layer.

In the array substrate described in the present application, the support pillar has a truncated cone shape with a narrower upper end and a wider bottom end.

In the array substrate described in the present application, the aperture includes a first via-hole positioned in the first insulating layer, a second via-hole positioned in the second insulating layer, and a third via-hole positioned in the first planarization layer, and radii of the third via-hole, the second via-hole, and the first via-hole are sequentially decreased.

In the array substrate described in the present application, the support filling structure is a second planarization layer disposed in the aperture and positioned in the light-transmitting functional area of the buffer layer, and a height of an upper surface of the second planarization layer is less than a height of an upper surface of the first planarization layer.

In the array substrate described in the present application, the first planarization layer is connected to the second planarization layer and they are formed by a mask.

In the array substrate described in the present application, the first metal layer is disposed on the buffer layer and positioned in the display area for forming a gate metal, the semiconductor layer is disposed on the first insulating layer for forming a channel layer, and the second metal layer is disposed on the first planarization layer for forming a source/drain metal layer.

An embodiment of the present application further provides a liquid crystal display panel, including an array substrate, and the array substrate includes: a substrate comprising a display area and a light-transmitting functional area; a buffer layer disposed on the substrate and covering the display area and the light-transmitting functional area; a thin film transistor array layer disposed on the buffer layer, wherein the thin film transistor array layer is provided with an aperture, the aperture and the light-transmitting functional area are aligned with each other; and a support filling structure disposed in the aperture.

In the liquid crystal display panel described in the present application, the thin film transistor array layer includes a first metal layer, a semiconductor layer, a second metal layer, a first insulating layer, a second insulating layer, and a first planarization layer; and wherein the first insulating layer is disposed on the buffer layer, the first planarization layer is disposed on the first insulating layer, and the second insulating layer is disposed on the first planarization layer.

In the liquid crystal display panel described in the present application, the support filling structure includes a plurality of support pillars distributed in uniform intervals in the apertures, the aperture is a via-hole penetrating to an upper surface of the buffer layer.

In the liquid crystal display panel described in the present application, the support pillar is a remaining portion of a first insulating layer, a first planarization layer, and a second insulating layer which is sequentially stacked in a groove formed on the thin film transistor array layer.

In the liquid crystal display panel described in the present application, the support pillar has a truncated cone shape with a narrower upper end and a wider bottom end.

In the liquid crystal display panel described in the present application, the apertures includes a first via-hole positioned in the first insulating layer, a second via-hole positioned in the second insulating layer, and a third via-hole positioned in the planarization layer, and radii of the third via-hole, the second via-hole, and the first via-hole are sequentially decreased.

In the liquid crystal display panel described in the present application, the support filling structure is a second planarization layer disposed in the aperture and positioned in the light-transmitting functional area of the buffer layer, and a height of an upper surface of the second planarization layer is less than a height of an upper surface of the first planarization layer.

In the liquid crystal display panel described in the present application, the first planarization layer is connected to the second planarization layer and they are formed by a mask.

In the liquid crystal display panel described in the present application, the first metal layer is disposed on the buffer layer and positioned in the display area for forming a gate metal, the semiconductor layer is disposed on the first insulating layer for forming a channel layer, and the second metal layer is disposed on the first planarization layer for forming a source/drain metal layer.

BENEFICIAL EFFECT

An array substrate and a liquid crystal display panel provided by embodiments of the present invention add a support filling structure in an aperture to change structure of the aperture, thereby improving flatness, preventing generation of interference fringes at the aperture, and improving display quality.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, and other drawings can also be obtained by a person having ordinary skill in the field based on these drawings, without making any creative effort.

DETAILED DESCRIPTION OF PREFERRED EMBODIMENTS

Figure 1:
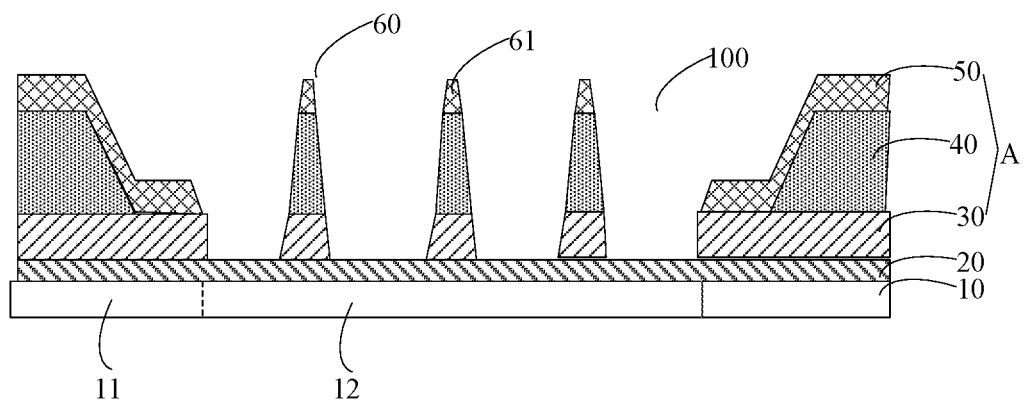
FIG. 1 is a schematic structural diagram of an array substrate according to an embodiment of the present application.

The embodiments of the present application are described in detail below, and the examples of the embodiments are illustrated in the drawings, wherein the same or similar reference numerals are used to refer to the same or similar elements or elements having the same or similar functions. The embodiments described below with reference to the accompanying drawings are intended to be illustrative and are not to be construed as limiting.

In the description of the present application, it is to be understood that the terms mentioned in the application, such as "center", "longitudinal", "transverse", "length", "width", "thickness", "upper", "lower", "front", "behind", "left", "right", "vertical", "horizontal", "top", "bottom", "inside", "outside", "clockwise", "counterclockwise", etc. are only refer to the orientation or positional relationship of the accompanying drawings. The description is merely for the purpose of describing the present invention and the simplification of the present invention and does not indicate or imply that the device or component referred to has a specific orientation, operated in a specific orientation. Thus, it should not be construed as limiting the application. Moreover, the terms "first" and "second" are used for descriptive purposes only, and are not to be construed as indicating or implying relative importance or implicitly indicating the number of technical features indicated. Thus, features defined with "first" or "second" may include one or more of the described features either explicitly or implicitly. In the description of the present application, the meaning of "a plurality" is two or more unless specifically defined otherwise.

Please refer to FIG. 1. FIG. 1 is a schematic structural diagram of an array substrate according to an embodiment of the present application. In the embodiment, the array substrate includes a substrate 10, a buffer layer 20, a thin film transistor array layer A, and a support filling structure 60. The substrate 10 includes a display area 11 and a light-transmitting functional area 12. The buffer layer 20 is disposed on the substrate 10, and covers the display area 11 and the light-transmitting functional area 12. The thin film transistor array layer A is disposed on the buffer layer 20 and is provided with an aperture 100, the aperture 100 and the light-transmitting functional area 12 are aligned with each other, and the support filling structure 60 is disposed in the aperture 100.

Wherein, in some embodiments, the light-transmitting functional area 12 is used to allow light to be collected by a camera or a photosensitive sensor disposed below the light-transmitting function area. Of course, it is not limited thereto.

Specifically, in some embodiments, the thin film transistor array layer includes a first metal layer, a semiconductor layer, a second metal layer, a first insulating layer 30, a second insulating layer 50, and a first planarization layer 40. The first insulating layer 30 is disposed on the buffer layer 20, the first planarization layer 40 is disposed on the first insulating layer 30, and the second insulating layer 50 is disposed on the first planarization layer 40. Wherein, the first metal layer is disposed on the buffer layer 20 and positioned in the display area 11 to form a gate metal. The semiconductor layer is disposed on the first insulating layer 30 to form a channel layer. The second metal layer is disposed on the first planarization layer 40 to form a source/drain metal layer. The order of the first metal layer, the semiconductor layer, and the second metal layer may change, which belongs to prior art and will not be described herein.

In the present embodiment, the support filling structure 60 includes a plurality of support pillars 61 distributed in uniform intervals in the aperture 100, and the aperture 100 is a via-hole penetrating to an upper surface of the buffer layer 20.

Wherein the first insulating layer 30, the second insulating layer 50, and the first planarization layer 40 may be formed by a chemical vapor deposition process using an insulating material such as silicon nitride or silicon dioxide.

In some embodiments, the support pillars 61 are formed by remaining portions of the first insulating layer 30, the first planarization layer 40 and the second insulating layer 50 sequentially stacked in a groove on the thin film transistor array layer. That is, when the aperture 100 is formed by a photolithography process, an area each of the support pillars 61 is facing corresponds to a light-shielding area on a mask. The support pillars 61 have a truncated cone shape with a narrower upper end and a wider bottom end. Of course, the support pillars 61 may also be cylindrical or conical, and it is not limited thereto.

Figure 2:
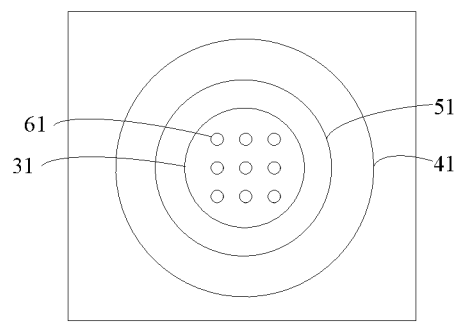
FIG. 2 is a schematic structural diagram of an aperture of an array substrate according to an embodiment of the present application.

Please also refer to FIG. 2. FIG. 2 is a schematic structural diagram of an aperture of an array substrate according to an embodiment of the present application. Wherein the aperture 100 includes a first via-hole 31 positioned in the first insulating layer 30, a second via-hole 51 positioned in the second insulating layer 50, and a third via-hole 41 positioned in the first planarization layer 40, and radii of the third via-hole 41, the second via-hole 51, and the first via-hole 31 are sequentially decreased.

The array substrate and the liquid crystal display panel provided by embodiments of the present invention add a support filling structure (a plurality of supporting pillars) in the aperture to change the aperture structure, thereby improving flatness, preventing generation of interference fringes at the aperture, and improving display quality.

Figure 3:
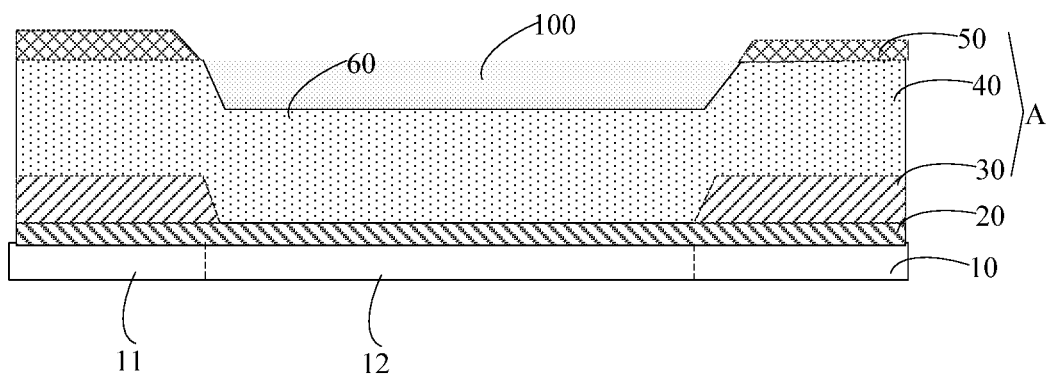
FIG. 3 is another schematic structural diagram of an array substrate according to an embodiment of the present application.

Please refer to FIG. 3. FIG. 3 is another schematic structural diagram of an array substrate according to an embodiment of the present application. In the embodiment, the array substrate includes a substrate 10, a buffer layer 20, a thin film transistor array layer A, and a support filling structure 60. The substrate 10 includes a display area 11 and a light-transmitting functional area 12. The buffer layer 20 is disposed on the substrate 10, and covers the display area 11 and the light-transmitting functional area 12. The thin film transistor array layer A is disposed on the buffer layer 20. The thin film transistor array layer is provided with an aperture 100, the aperture 100 and the light-transmitting functional area 12 are aligned with each other, and the support filling structure 60 is disposed in the aperture 100.

Specifically, in some embodiments, the thin film transistor array layer includes a first metal layer, a semiconductor layer, a second metal layer, a first insulating layer 30, a second insulating layer 50, and a first planarization layer 40. The first insulating layer 30 is disposed on the buffer layer 20, the first planarization layer 40 is disposed on the first insulating layer 30, and the second insulating layer 50 is disposed on the first planarization layer 40. Wherein, the first metal layer is disposed on the buffer layer 20 and positioned in the display area 11 to form a gate metal. The semiconductor layer is disposed on the first insulating layer 30 to form a channel layer. The second metal layer is disposed on the first planarization layer 40 to form a source/drain metal layer. The order of the first metal layer, the semiconductor layer, and the second metal layer may change, which belongs to prior art and will not be described herein.

In some embodiments, the support filling structure 60 is a second planarization layer disposed in the aperture 100 and positioned in the light-transmitting functional area 12 of the buffer layer 20, and a height of an upper surface of the second planarization layer is less than a height of an upper surface of the first planarization layer 40. The first planarization layer 40 is connected to the second planarization layer, and they are formed by one-step mask. That is, the first planarization layer 40 and the second planarization layer are integrated. Of course, it is not limited thereto.

In some embodiments, the support filling structure 60 is a second planarization layer disposed in the aperture 100 and positioned in the light-transmitting functional area 12 of the buffer layer 20, and a height of an upper surface of the second planarization layer is less than a height of an upper surface of the first planarization layer 40.

Figure 4:
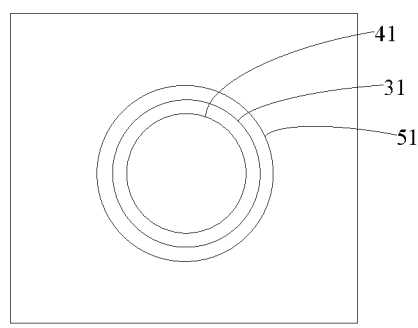
FIG. 4 is yet another schematic structural diagram of an aperture of an array substrate according to an embodiment of the present application.

Please refer to FIG. 4. FIG. 4 is yet another schematic structural diagram of an aperture of an array substrate according to an embodiment of the present application. Aperture 100 includes a first via-hole 31 positioned in the first insulating layer 30, a second via-hole 51 positioned in the second insulating layer 50, and a third via-hole 41 positioned in the planarization layer 40, and radii of the second via-hole 51, the first via-hole 31, and the third via-hole 41 are sequentially decreased.

The array substrate and the liquid crystal display panel provided by embodiments of the present invention add a support filling structure (second planarization layer) in the aperture to change the aperture structure, thereby improving flatness, preventing generation of interference fringes at the aperture site, and improving display quality.

The present application further provides a liquid crystal display panel, including the array substrate described above. The array substrate and the liquid crystal display panel provided by embodiments of the present invention add a support filling structure (for example, the second planarization layer or a plurality of support pillars) in the aperture to change the aperture structure, thereby improving flatness, preventing generation of interference fringes at the aperture, and improving display quality.

In the description of the present specification, the terms "one embodiment", "some embodiments", "illustrative embodiments", "example", "specific examples", or "some examples", etc. mean that the specific features, structures, materials, or characteristics in the embodiments or examples are included in at least one embodiment or example of the invention. In the present specification, the schematic representation of the above terms does not necessarily mean the same embodiment or example. Furthermore, the specific features, structures, materials, or characteristics described may be combined in a suitable manner in any one or more embodiments or examples.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. An array substrate, comprising:
   a substrate, comprising a display area and a light-transmitting functional area;
   a buffer layer disposed on the substrate and covering the display area and the light-transmitting functional area;
   a thin film transistor array layer comprising a first metal layer, a semiconductor layer, a second metal layer, a first insulating layer, a second insulating layer, and a first planarization layer, wherein the first insulating layer is disposed on the buffer layer, the first planarization layer is disposed on the first insulating layer, and the second insulating layer is disposed on the first planarization layer, and wherein the thin film transistor array layer is defined with an aperture, and the aperture and the light-transmitting functional area are aligned with each other; and
   a support filling structure disposed in the aperture;
   wherein the support filling structure comprises a plurality of support pillars distributed in uniform intervals in the aperture, and the aperture is a via-hole penetrating the thin film transistor array layer until to an upper surface of the buffer layer, and wherein each support pillar is a stack formed by a remaining portion of the first insulating layer, the first planarization layer, and the second insulating layer in the via-hole defined on the thin film transistor array layer.

2. The array substrate according to claim 1, wherein each support pillar has a truncated cone shape with a narrower upper end and a wider bottom end.

3. The array substrate according to claim 1, wherein the aperture comprises a first via-hole positioned in the first insulating layer, a second via-hole positioned in the second insulating layer, and a third via-hole positioned in the first planarization layer, and radii of the third via-hole, the second via-hole, and the first via-hole are sequentially decreased.

4. The array substrate according to claim 1, wherein the support filling structure is a second planarization layer disposed on a portion of the buffer layer positioned in the light-transmitting functional area, and wherein a height of an upper surface of the second planarization layer is less than a height of an upper surface of the first planarization layer.

5. The array substrate according to claim 4, wherein the first planarization layer is connected to the second planarization layer, and the first planarization layer and the second planarization layer are formed by a mask.

6. The array substrate according to claim 1, wherein the first metal layer is disposed on the buffer layer and positioned in the display area to form a gate metal, the semiconductor layer is disposed on the first insulating layer to form a channel layer, and the second metal layer is disposed on the first planarization layer to form a source/drain metal layer.

7. A liquid crystal display panel, comprising an array substrate, wherein the array substrate comprises:
- a substrate comprising a display area and a light-transmitting functional area;
- a buffer layer disposed on the substrate and covering the display area and the light-transmitting functional area;
- a thin film transistor array layer comprising a first metal layer, a semiconductor layer, a second metal layer, a first insulating layer, a second insulating layer, and a first planarization layer, wherein the first insulating layer is disposed on the buffer layer, the first planarization layer is disposed on the first insulating layer, and the second insulating layer is disposed on the first planarization layer, and wherein the thin film transistor array layer is defined with an aperture, and the aperture and the light-transmitting functional area are aligned with each other; and
- a support filling structure disposed in the aperture;
- wherein the support filling structure comprises a plurality of support pillars distributed in uniform intervals in the aperture, and the aperture is a via-hole penetrating the thin film transistor array layer until to an upper surface of the buffer layer, and wherein each support pillar is a stack formed by a remaining portion of the first insulating layer, the first planarization layer, and the second insulating layer in the via-hole defined on the thin film transistor array layer.

8. The liquid crystal display panel according to claim 7, wherein each support pillar has a truncated cone shape with a narrower upper end and a wider bottom end.

9. The liquid crystal display panel according to claim 7, wherein the aperture comprises a first via-hole positioned in the first insulating layer, a second via-hole positioned in the second insulating layer, and a third via-hole positioned in the planarization layer, and radii of the third via-hole, the second via-hole, and the first via-hole are sequentially decreased.

10. The liquid crystal display panel according to claim 7, wherein the support filling structure is a second planarization layer disposed on a portion of the buffer layer positioned in the light-transmitting functional area, and wherein a height of an upper surface of the second planarization layer is less than a height of an upper surface of the first planarization layer.

11. The liquid crystal display panel according to claim 10, wherein the first planarization layer is connected to the second planarization layer, and the first planarization layer and the second planarization layer are formed by a mask.

12. The liquid crystal display panel according to claim 7, wherein the first metal layer is disposed on the buffer layer and positioned in the display area to form a gate metal, the semiconductor layer is disposed on the first insulating layer to form a channel layer, and the second metal layer is disposed on the first planarization layer to form a source/drain metal layer.

* * * * *